United States Patent
Chae et al.

(10) Patent No.: US 11,993,846 B2
(45) Date of Patent: May 28, 2024

(54) METHOD OF PREPARING POSITIVE ELECTRODE ACTIVE MATERIAL FOR SECONDARY BATTERY

(71) Applicant: LG Energy Solution, Ltd., Seoul (KR)

(72) Inventors: Seul Ki Chae, Daejeon (KR); Dae Jin Lee, Daejeon (KR); Dong Hwi Kim, Daejeon (KR); Jin Tae Hwang, Daejeon (KR); Hyeong Il Kim, Daejeon (KR); Wang Mo Jung, Daejeon (KR); Dong Hun Lee, Daejeon (KR)

(73) Assignee: LG Energy Solution, Ltd., Seoul (KR)

(*) Notice: Subject to any disclaimer, the term of this patent is extended or adjusted under 35 U.S.C. 154(b) by 198 days.

(21) Appl. No.: 17/781,925

(22) PCT Filed: Jan. 12, 2021

(86) PCT No.: PCT/KR2021/000406
§ 371 (c)(1),
(2) Date: Jun. 2, 2022

(87) PCT Pub. No.: WO2021/145647
PCT Pub. Date: Jul. 22, 2021

(65) Prior Publication Data
US 2023/0002899 A1 Jan. 5, 2023

(30) Foreign Application Priority Data
Jan. 14, 2020 (KR) .................. 10-2020-0004990

(51) Int. Cl.
*H01M 4/04* (2006.01)
*C23C 16/455* (2006.01)
(Continued)

(52) U.S. Cl.
CPC ..... *C23C 16/45555* (2013.01); *H01M 4/0428* (2013.01); *H01M 4/366* (2013.01);
(Continued)

(58) Field of Classification Search
CPC ................................ H01M 4/0428
See application file for complete search history.

(56) References Cited

U.S. PATENT DOCUMENTS

2012/0077082 A1 3/2012 Se-Hee et al.
2014/0162132 A1 6/2014 Ishii et al.
(Continued)

FOREIGN PATENT DOCUMENTS

CN 106384838 A 2/2017
CN 108767212 A 11/2018
(Continued)

OTHER PUBLICATIONS

Search report from International Application No. PCT/KR2021/000406, dated Apr. 22, 2021.
(Continued)

*Primary Examiner* — Austin Murata
(74) *Attorney, Agent, or Firm* — Lerner David LLP

(57) ABSTRACT

A method of preparing a positive electrode active material for a secondary battery includes preparing a lithium composite transition metal oxide which includes nickel, cobalt, and manganese and contains 60 mol % or more of the nickel among all metals except lithium, adding a moisture absorbent and the lithium composite transition metal oxide into an atomic layer deposition (ALD) reactor, and adding a coating metal precursor into the atomic layer deposition (ALD) reactor and forming a metal oxide coating layer on surfaces of particles of the lithium composite transition metal oxide by atomic layer deposition (ALD).

13 Claims, 3 Drawing Sheets

(51) Int. Cl.
  *H01M 4/36* (2006.01)
  *H01M 4/505* (2010.01)
  *H01M 4/525* (2010.01)
  *H01M 4/02* (2006.01)

(52) U.S. Cl.
  CPC ........... *H01M 4/505* (2013.01); *H01M 4/525* (2013.01); *H01M 2004/028* (2013.01)

(56) References Cited

U.S. PATENT DOCUMENTS

| | | | |
|---|---|---|---|
| 2017/0018760 | A1 | 1/2017 | Lupart et al. |
| 2017/0155132 | A1 | 6/2017 | Kong et al. |
| 2020/0274138 | A1 | 8/2020 | Weimer et al. |
| 2020/0377999 | A1 | 12/2020 | Cetinel et al. |

FOREIGN PATENT DOCUMENTS

| | | | |
|---|---|---|---|
| CN | 109860545 | A | 6/2019 |
| CN | 110556531 | A | 12/2019 |
| JP | 2017050204 | A | 3/2017 |
| KR | 20130014245 | A | 2/2013 |
| KR | 20140084566 | A | 7/2014 |
| KR | 20170063143 | A | 6/2017 |
| KR | 20170096614 | A | 8/2017 |
| KR | 20180011207 | A | 1/2018 |
| KR | 20180102874 | A | 9/2018 |
| KR | 101944381 | B1 | 1/2019 |
| KR | 20190042992 | A | 4/2019 |
| WO | 2015150167 | A1 | 10/2015 |
| WO | 2018162234 | A1 | 9/2018 |
| WO | 2019094190 | A1 | 5/2019 |

OTHER PUBLICATIONS

Mohanty, D., et al., "Modification of Ni-Rich FCG NMC and NCA Cathodes by Atomic Layer Deposition: Preventing Surface Phase Transitions for High-Voltage Lithium-Ion Batteries." Scientific Reports, Published May 26, 2016, vol. 6, 26532, pp. 1-16.

Zhu, W., et al., "Ultrathin Al2O3 Coating on LiNi0.8Co0.1Mn0.1O2 Cathode Material for Enhanced Cycleability at Extended Voltage Ranges." Coatings, published Feb. 3, 2019, vol. 9, 92, pp. 1-12.

Extended European Search Report including Written Opinion for Application No. 21741348.3 dated Sep. 14, 2023, pp. 1-7.

METHOD OF PREPARING POSITIVE ELECTRODE ACTIVE MATERIAL FOR SECONDARY BATTERY

TECHNICAL FIELD

The present application is a national phase entry under 35 U.S.C. § 371 of International Application No. PCT/KR2021/000406 filed on Jan. 12, 2021, which claims priority from Korean Patent Application No. 10-2020-0004990, filed on Jan. 14, 2020, the disclosures of which are incorporated by reference herein.

The present invention relates to a method of preparing a positive electrode active material for a secondary battery.

BACKGROUND ART

Recently, with the rapid spread of electronic devices using batteries, such as mobile phones, notebook computers, and electric vehicles, demand for secondary batteries with relatively high capacity as well as small size and lightweight has been rapidly increased. Particularly, since a lithium secondary battery is lightweight and has high energy density, the lithium secondary battery is in the spotlight as a driving power source for portable devices. Accordingly, research and development efforts for improving the performance of the lithium secondary battery have been actively conducted.

In the lithium secondary battery in a state in which an organic electrolyte solution or a polymer electrolyte solution is filled between a positive electrode and a negative electrode which are respectively formed of active materials capable of intercalating and deintercalating lithium ions, electrical energy is produced by oxidation and reduction reactions when the lithium ions are intercalated/deintercalated into/from the positive electrode and the negative electrode.

Lithium cobalt oxide ($LiCoO_2$), lithium nickel oxide ($LiNiO_2$), lithium manganese oxide ($LiMnO_2$ or $LiMn_2O_4$, etc.), or a lithium iron phosphate compound ($LiFePO_4$) has been used as a positive electrode active material of the lithium secondary battery. Among these materials, since the lithium cobalt oxide ($LiCoO_2$) is advantageous in that its operating voltage is high and capacity characteristics are excellent, the lithium cobalt oxide ($LiCoO_2$) has been widely used and has been used as a positive electrode active material for high voltage. However, since there is a limitation in using a large amount of the $LiCoO_2$ as a power source for applications, such as electric vehicles, due to the rising price and unstable supply of cobalt (Co), there emerges a need to develop a positive electrode active material capable of replacing the $LiCoO_2$.

Accordingly, a nickel cobalt manganese-based lithium composite transition metal oxide (hereinafter, simply referred to as 'NOM-based lithium composite transition metal oxide'), in which a portion of cobalt (Co) is substituted with nickel (Ni) and manganese (Mn), has been developed. Recently, research to increase capacity by increasing an amount of Ni in the NCM-based lithium composite transition metal oxide has been conducted. However, with respect to a high-nickel (high-Ni) positive electrode active material with a high nickel content, high capacity may be realized, but, since side reactions, such as oxygen desorption and electrolyte oxidation, occur at an interface in contact with an electrolyte during charge, there are disadvantages of increasing resistance and causing gas generation and degradation of lifetime.

Thus, there is a need to develop a high-Ni positive electrode active material having excellent surface stability, less side reaction with an electrolyte solution, and excellent thermal stability while meeting high capacity requirements.

DISCLOSURE OF THE INVENTION

Technical Problem

An aspect of the present invention provides a method of preparing a positive electrode active material for a secondary battery which may improve surface stability while minimizing film resistance, may effectively suppress a direct contact with an electrolyte solution and an interfacial side reaction, and may improve a reaction yield by forming a thin and uniform coating layer on a surface of a high-Ni positive electrode active material.

Technical Solution

According to an aspect of the present invention, there is provided a method of preparing a positive electrode active material for a secondary battery which includes: preparing a lithium composite transition metal oxide which includes nickel, cobalt, and manganese and contains 60 mol % or more of the nickel among all metals except lithium; adding a moisture absorbent and the lithium composite transition metal oxide into an atomic layer deposition (ALD) reactor; and adding a coating metal precursor into the atomic layer deposition (ALD) reactor, and forming a metal oxide coating layer on surfaces of particles of the lithium composite transition metal oxide by atomic layer deposition (ALD).

Advantageous Effects

According to the present invention, a thin and uniform coating layer may be effectively formed on a surface of a high-Ni positive electrode active material, and a reaction yield may be improved.

Since the thin and uniform coating layer is formed on the surface of the high-Ni positive electrode active material according to an aspect of the present invention, problems of deterioration in structural/chemical stability and surface stability caused by an increase in nickel (Ni) may be improved in addition to the realization of high capacity and a direct contact with an electrolyte solution and an interfacial side reaction may be effectively suppressed while minimizing film resistance. Accordingly, resistance characteristics and degradation of lifetime of a lithium secondary battery may be significantly improved.

MODE FOR CARRYING OUT THE INVENTION

Figure 1:
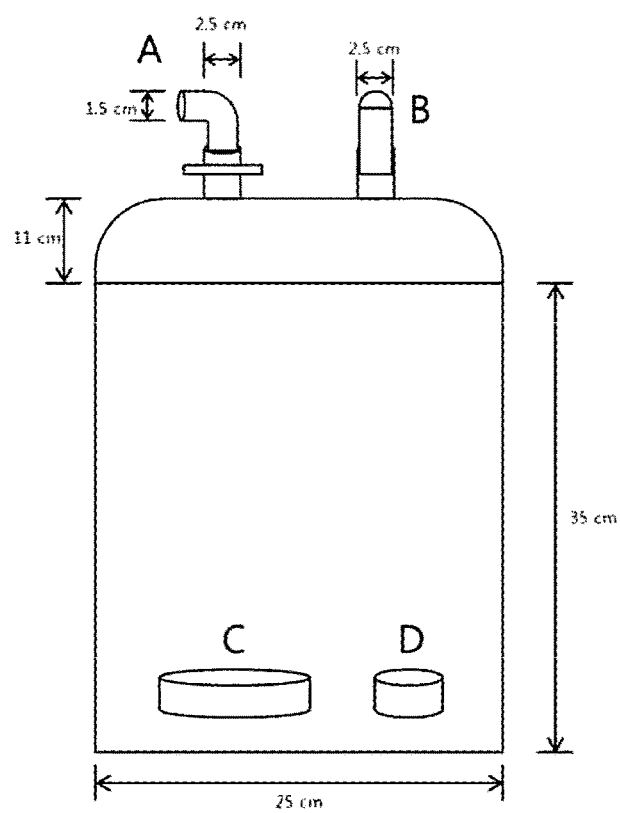
FIG. 1 is a schematic view illustrating an embodiment of an atomic layer deposition (ALD) reactor.
Figure 2:
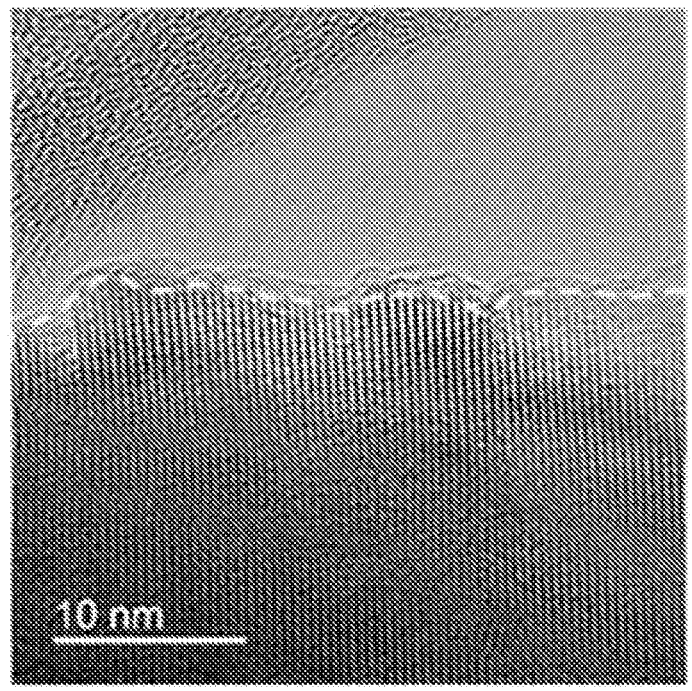
FIG. 2 is a transmission electron microscope (TEM) image of a positive electrode active material prepared in Example 1.
Figure 3:
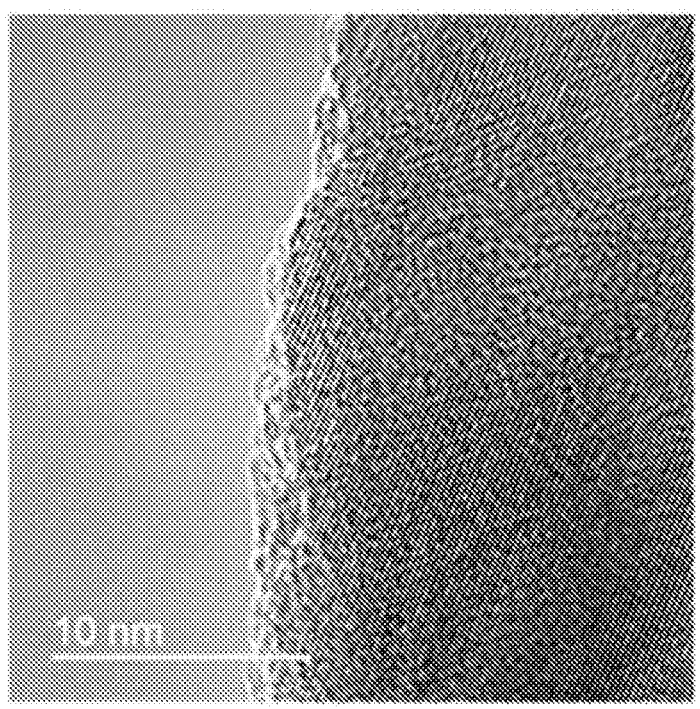
FIG. 3 is a transmission electron microscope (TEM) image of a positive electrode active material prepared in Example 2.
Figure 4:
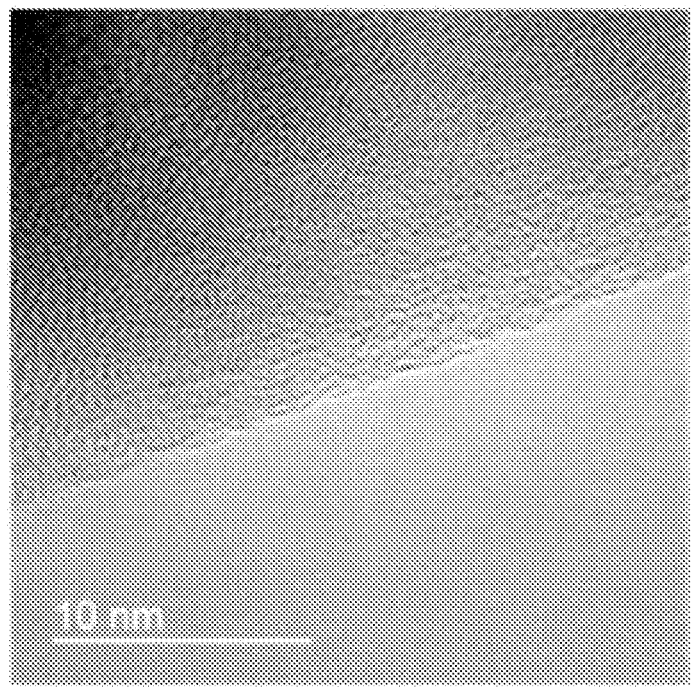
FIG. 4 is a transmission electron microscope (TEM) image of a positive electrode active material prepared in Comparative Example 1.
Figure 5:
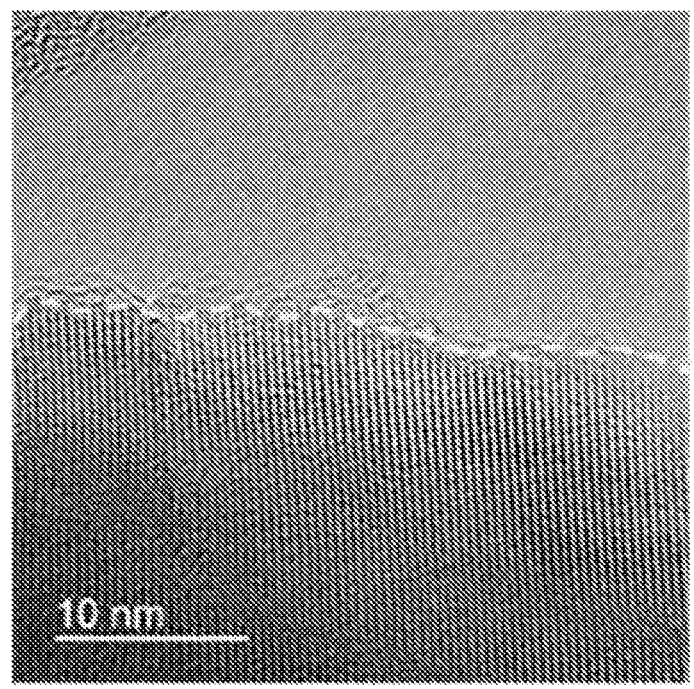
FIG. 5 is a transmission electron microscope (TEM) image of a positive electrode active material prepared in Comparative Example 2.

Hereinafter, the present invention will be described in more detail to allow for a clearer understanding of the present invention.

<Method of Preparing Positive Electrode Active Material>

The present invention provides a method of preparing a positive electrode active material for a secondary battery which includes the steps of: preparing a lithium composite transition metal oxide which includes nickel, cobalt, and manganese and contains 60 mol % or more of the nickel among all metals except lithium; adding a moisture absorbent and the lithium composite transition metal oxide into an atomic layer deposition (ALD) reactor; and adding a coating metal precursor into the atomic layer deposition (ALD) reactor, and forming a metal oxide coating layer on surfaces of particles of the lithium composite transition metal oxide by atomic layer deposition (ALD).

The method of preparing a positive electrode active material for a secondary battery will be described in detail for each step.

First, a lithium composite transition metal oxide, which includes nickel, cobalt, and manganese and contains 60 mol % or more of the nickel among all metals except lithium, is prepared. The lithium composite transition metal oxide is a NCM-based lithium composite transition metal oxide including nickel (Ni), cobalt (Co), and manganese (Mn). The lithium composite transition metal oxide is a high-Ni NCM-based lithium composite transition metal oxide in which an amount of the nickel (Ni) in a total amount of the metals except lithium (Li) is 60 mol % or more. Preferably, the amount of the nickel (Ni) may be 70 mol % or more, for example, 80 mol % or more. Since the amount of the nickel (Ni) in the total amount of the metals except lithium (Li) satisfies 60 mol % or more, higher capacity may be secured.

The lithium composite transition metal oxide may be represented by the following Formula 1.

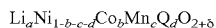

$$Li_aNi_{1-b-c-d}Co_bMn_cQ_dO_{2+\delta}$$ [Formula 1]

In Formula 1, Q is at least one element selected from the group consisting of aluminum (Al), magnesium (Mg), vanadium (V), titanium (Ti), and zirconium (Zr), $1.0 \leq a \leq 1.5$, $0 < b \leq 0.5$, $0 < c \leq 0.5$, $0 \leq d \leq 0.1$, $0 < b+c+c \leq 0.4$, and $-0.1 \leq \delta \leq 1.0$.

In the lithium composite transition metal oxide of Formula 1, Li may be included in an amount corresponding to a, that is, $1.0 \leq a \leq 1.5$. When a is less than 1.0, capacity may be reduced, and, when a is greater than 1.5, since particles are sintered in a sintering process, the preparation of the positive electrode active material may be difficult. The Li may more preferably be included in an amount satisfying $1.1 \leq a \leq 1.2$, in consideration of balance between a significant capacity characteristics improvement effect of the positive electrode active material and sinterability during the preparation of the active material due to the control of the amount of the Li.

In the lithium composite transition metal oxide of Formula 1, Ni may be included in an amount corresponding to $1-(b+c+d)$, for example, $0.6 \leq 1-(b+c+d) < 1$. If the amount of the Ni in the lithium composite transition metal oxide of Formula 1 is 0.6 or more, since the amount of the Ni, which is sufficient to contribute to charge and discharge, is secured, high capacity may be achieved. The Ni may more preferably be included in an amount satisfying $0.80 \leq 1-(b+c+d) \leq 0.99$.

In the lithium composite transition metal oxide of Formula 1, Co may be included in an amount corresponding to b, that is, $0 < b \leq 0.5$. In a case in which the amount of the Co in the lithium composite transition metal oxide of Formula 1 is greater than 0.5, there is a concern that cost may increase. The Co may specifically be included in an amount satisfying $0.05 < b \leq 0.2$ in consideration of a significant capacity characteristics improvement effect due to the inclusion of the Co.

In the lithium composite transition metal oxide of Formula 1, Mn may be included in an amount corresponding to c, that is, $0 < c \leq 0.5$. If c in the lithium composite transition metal oxide of Formula 1 is greater than 0.5, there is a concern that output characteristics and capacity characteristics of the battery may be degraded, and the Mn may specifically be included in an amount satisfying $0.05 \leq c \leq 0.2$.

In the lithium composite transition metal oxide of Formula 1, Q may be a doping element included in a crystal structure of the lithium composite transition metal oxide, wherein the Q may be included in an amount corresponding to d, that is, $0 \leq d \leq 0.1$.

The lithium composite transition metal oxide of the present invention is a high-Ni NCM-based lithium composite transition metal oxide containing 60 mol % or more of nickel among the all metals except lithium, wherein it may secure high capacity, but surface stability is reduced due to an increase in nickel content, and, since side reactions, such as oxygen desorption and electrolyte oxidation, occur at an interface in contact with an electrolyte during charge, there are disadvantages of increasing resistance and causing gas generation and degradation of lifetime. Thus, in an aspect of the present invention, since a thin and uniform metal oxide coating layer is formed on surfaces of particles of the high-Ni NCM-based lithium composite transition metal oxide by atomic layer deposition (ALD), a problem of deterioration in the surface stability may be improved and a direct contact with an electrolyte solution and an interfacial side reaction may be effectively suppressed while minimizing film resistance. Hereinafter, the formation of the coating layer by the atomic layer deposition (ALD) of the present invention will be described in detail.

Next, a moisture absorbent and the lithium composite transition metal oxide are added into an atomic layer deposition (ALD) reactor.

In a case in which moisture is present in the reactor during atomic layer deposition (ALD), even a very small amount of the moisture may be adsorbed on the surfaces of the lithium composite transition metal oxide particles to reduce a yield of the atomic layer deposition (ALD) and to make it difficult to uniformly treat the surface. Particularly, since the NCM-based lithium composite transition metal oxide, furthermore, the high-Ni NCM-based lithium composite transition metal oxide is very vulnerable to moisture, moisture absorption is important in a surface treatment process and it becomes an important factor in determining battery performance when the high-Ni NCM-based lithium composite transition metal oxide is used in a lithium secondary battery.

Thus, in an embodiment of the present invention, a reaction yield may not only be improved, but a more uniform coating layer may also be formed by adding a moisture absorbent into the atomic layer deposition (ALD) reactor. The moisture absorbent may be at least one selected from the group consisting of $P_2O_5$, $K_2O$, CaO, $Na_2O$, zeolite, LiO, and MgO, and, more preferably, $P_2O_5$ may be used. A moisture content of the lithium composite transition metal oxide in the atomic layer deposition (ALD) reactor may be allowed to be 300 ppm or less before performing the atomic layer deposition (ALD) due to the addition of the moisture absorbent, and, more preferably, the moisture content of the lithium composite transition metal oxide in the atomic layer deposition (ALD) reactor may be allowed to be 200 ppm to 250 ppm.

Next, a coating metal precursor is added into the atomic layer deposition (ALD) reactor, and a metal oxide coating layer is formed on the surfaces of the lithium composite transition metal oxide particles by atomic layer deposition (ALD).

In this case, the inside of the atomic layer deposition (ALD) reactor may be allowed to be in a vacuum state before performing the atomic layer deposition (ALD). According to an embodiment of the present invention, the reaction yield may be further improved by making the inside of the reactor in a vacuum state, instead of using a carrier gas, as a conventional inert gas such as $N_2$ gas or Ar gas.

The coating metal precursor may include at least one selected from the group consisting of aluminum (Al), titanium (Ti), silicon (Si), zirconium (Zr), vanadium (V), niobium (Nb), magnesium (Mg), tantalum (Ta), boron (B), zinc (Zn), tin (Sn), hafnium (Hf), erbium (Er), lanthanum (La), indium (In), yttrium (Y), cerium (Ce), scandium (Sc), and tungsten (W), may preferably include at least one selected from the group consisting of Al, Zr, and Si, and may more preferably include Al, and, when the coating metal precursor includes the above-described metal atoms, it is more preferable in terms of preventing an increase in resistance and preventing an electrolyte solution side reaction.

Specifically, when the coating metal precursor includes Al, the metal precursor may include at least one selected from the group consisting of trimethyl aluminum (TMA), triethylaluminum (TEA), and tris(diethylamido)aluminum (TBTDET), and may more preferably include trimethylaluminum.

The metal oxide coating layer may include at least one selected from the group consisting of $Al_2O_3$, $TiO_2$, $SiO_2$, $ZrO_2$, $VO_2$, $V_2O_5$, $Nb_2O_5$, $MgO$, $TaO_2$, $Ta_2O_5$, $B_2O_2$, $B_4O_3$, $B_4O_5$, $ZnO$, $SnO$, $HfO_2$, $Er_2O_3$, $La_2O_3$, $In_2O_3$, $Y_2O_3$, $Ce_2O_3$, $Sc_2O_3$, and $W_2O_3$, and may more preferably include $Al_2O_3$, in terms of improving an effect of preventing the increase in the resistance of the metal oxide coating layer and preventing the electrolyte solution side reaction.

The atomic layer deposition (ALD) may be performed in a temperature range of 80° C. to 120° C., for example, 100° C. to 120° C., and, when the ALD is performed in the above-described temperature range, it is preferable in terms of smooth reaction and uniform formation of the coating layer.

The metal oxide coating layer may be formed by performing the atomic layer deposition (ALD) for 1 cycle to 8 cycles, and may more preferably be formed by performing the ALD for 2 cycles to 6 cycles. When the atomic layer deposition is performed with the above-described number of cycles, it is desirable that the electrolyte solution side reaction may be effectively prevented while an increase in the resistance due to an excessive increase in thickness of the coating layer may be prevented.

FIG. 1 is a schematic view illustrating an embodiment of the atomic layer deposition (ALD) reactor. Referring to FIG. 1, a vacuum pump connecting part A is a connecting part configured to connect a vacuum pump and the reactor, wherein the inside of the reactor may be made into a vacuum or the inside of the reactor may be changed to normal pressure before and after the reaction by opening or closing a clamp. A precursor inlet B is a place where a precursor material is added, wherein it may be sealed with a silicon septa so as not to affect a degree of vacuum inside the reactor even after injection. A lithium composite transition metal oxide positioning part C and a moisture absorbent positioning part D may be places where the lithium composite transition metal oxide and the moisture absorbent are placed, respectively.

A thickness of the metal oxide coating layer may be formed to be in a range of 1.5 nm or less, preferably 0.8 nm to 1.2 nm, and more preferably 1.0 nm to 1.2 nm. When the thickness is within the above-described thickness range, it is desirable that the electrolyte solution side reaction may be effectively prevented while the increase in the resistance due to the excessive increase in the thickness of the coating layer may be prevented.

The positive electrode active material on which the metal oxide coating layer is formed may have a moisture content of 300 ppm or less, and, more preferably, the positive active material may have a moisture content of 200 ppm to 250 ppm.

When the positive electrode active material, in which the metal oxide coating layer is formed on the surfaces of the lithium composite transition metal oxide particles by the atomic layer deposition (ALD) according to the present invention, is used in a lithium secondary battery, since the interfacial side reaction may be effectively suppressed during charge, generation and accumulation of resistance components including an electrolyte solution by-product and a rock salt phase may be suppressed and the oxygen desorption and gas generation may be reduced, and, as a result, resistance characteristics and life characteristics of the secondary battery may be improved.

<Positive Electrode and Lithium Secondary Battery>

According to another embodiment of the present invention, provided are a positive electrode for a secondary battery and a lithium secondary battery which include the positive electrode active material prepared as described above.

Specifically, the positive electrode includes a positive electrode collector and a positive electrode active material layer which is disposed on the positive electrode collector and includes the positive electrode active material.

In the positive electrode, the positive electrode collector is not particularly limited as long as it has conductivity without causing adverse chemical changes in the battery, and, for example, stainless steel, aluminum, nickel, titanium, fired carbon, or aluminum or stainless steel that is surface-treated with one of carbon, nickel, titanium, silver, or the like may be used. Also, the positive electrode collector may typically have a thickness of 3 μm to 500 μm, and microscopic irregularities may be formed on the surface of the collector to improve the adhesion of the positive electrode active material. The positive electrode collector, for example, may be used in various shapes such as that of a film, a sheet, a foil, a net, a porous body, a foam body, a non-woven fabric body, and the like.

Also, the positive electrode active material layer may include a conductive agent and a binder in addition to the above-described positive electrode active material.

In this case, the conductive agent is used to provide conductivity to the electrode, wherein any conductive agent may be used without particular limitation as long as it has suitable electron conductivity without causing adverse chemical changes in the battery. Specific examples of the conductive agent may be graphite such as natural graphite or artificial graphite; carbon based materials such as carbon black, acetylene black, Ketjen black, channel black, furnace black, lamp black, thermal black, and carbon fibers; powder or fibers of metal such as copper, nickel, aluminum, and silver; conductive whiskers such as zinc oxide whiskers and potassium titanate whiskers; conductive metal oxides such as titanium oxide; or conductive polymers such as polyphenylene derivatives, and any one thereof or a mixture of two or more thereof may be used. The conductive agent may be typically included in an amount of 1 wt % to 30 wt % based on a total weight of the positive electrode active material layer.

Furthermore, the binder improves the adhesion between the positive electrode active material particles and the adhesion between the positive electrode active material and the current collector. Specific examples of the binder may be polyvinylidene fluoride (PVDF), polyvinylidene fluoride-hexafluoropropylene copolymer (PVDF-co-HFP), polyvinyl alcohol, polyacrylonitrile, carboxymethyl cellulose (CMC), starch, hydroxypropyl cellulose, regenerated cellulose, polyvinylpyrrolidone, polytetrafluoroethylene, polyethylene, polypropylene, an ethylene-propylene-diene monomer rubber (EPDM rubber), a sulfonated EPDM, a styrene-butadiene rubber (SBR), a fluorine rubber, or various copolymers thereof, and any one thereof or a mixture of two or more thereof may be used. The binder may be included in an amount of 1 wt % to 30 wt % based on the total weight of the positive electrode active material layer.

The positive electrode may be prepared according to a typical method of preparing a positive electrode except that the above-described positive electrode active material is used. Specifically, a composition for forming a positive electrode active material layer, which includes the above-described positive electrode active material as well as selectively the binder and the conductive agent, is coated on the positive electrode collector, and the positive electrode may then be prepared by drying and rolling the coated positive electrode collector. In this case, types and amounts of the positive electrode active material, the binder, and the conductive are the same as those previously described.

The solvent may be a solvent normally used in the art. The solvent may include dimethyl sulfoxide (DMSO), isopropyl alcohol, N-methylpyrrolidone (NMP), acetone, or water, and any one thereof or a mixture of two or more thereof may be used. An amount of the solvent used may be sufficient if the solvent may dissolve or disperse the positive electrode active material, the conductive agent, and the binder in consideration of a coating thickness of a slurry and manufacturing yield, and may allow to have a viscosity that may provide excellent thickness uniformity during the subsequent coating for the preparation of the positive electrode.

Also, as another method, the positive electrode may be prepared by casting the composition for forming a positive electrode active material layer on a separate support and then laminating a film separated from the support on the positive electrode collector.

According to another embodiment of the present invention, an electrochemical device including the positive electrode is provided. The electrochemical device may specifically be a battery or a capacitor, and, for example, may be a lithium secondary battery.

The lithium secondary battery specifically includes a positive electrode, a negative electrode disposed to face the positive electrode, a separator disposed between the positive electrode and the negative electrode, and an electrolyte, wherein the positive electrode is as described above. Also, the lithium secondary battery may further selectively include a battery container accommodating an electrode assembly of the positive electrode, the negative electrode, and the separator, and a sealing member sealing the battery container.

In the lithium secondary battery, the negative electrode includes a negative electrode collector and a negative electrode active material layer disposed on the negative electrode collector.

The negative electrode collector is not particularly limited as long as it has high conductivity without causing adverse chemical changes in the battery, and, for example, copper, stainless steel, aluminum, nickel, titanium, fired carbon, copper or stainless steel that is surface-treated with one of carbon, nickel, titanium, silver, or the like, and an aluminum-cadmium alloy may be used. Also, the negative electrode collector may typically have a thickness of 3 µm to 500 µm, and, similar to the positive electrode collector, microscopic irregularities may be formed on the surface of the collector to improve the adhesion of a negative electrode active material. The negative electrode collector, for example, may be used in various shapes such as that of a film, a sheet, a foil, a net, a porous body, a foam body, a non-woven fabric body, and the like.

The negative electrode active material layer selectively includes a binder and a conductive agent in addition to the negative electrode active material. The negative electrode active material layer may be prepared by coating a composition for forming a negative electrode in the form of a slurry, which includes selectively the binder and the conductive agent as well as the negative electrode active material, on the negative electrode collector and drying the coated negative electrode collector, or may be prepared by casting the composition for forming a negative electrode on a separate support and then laminating a film separated from the support on the negative electrode collector.

A compound capable of reversibly intercalating and deintercalating lithium may be used as the negative electrode active material. Specific examples of the negative electrode active material may be a carbonaceous material such as artificial graphite, natural graphite, graphitized carbon fibers, and amorphous carbon; a metallic compound alloyable with lithium such as silicon (Si), aluminum (Al), tin (Sn), lead (Pb), zinc (Zn), bismuth (Bi), indium (In), magnesium (Mg), gallium (Ga), cadmium (Cd), a Si alloy, a Sn alloy, or an Al alloy; a metal oxide which may be doped and undoped with lithium such as $SiO_\mu(0<\beta<2)$, $SnO_2$, vanadium oxide, and lithium vanadium oxide; or a composite including the metallic compound and the carbonaceous material such as a Si—C composite or a Sn—C composite, and any one thereof or a mixture of two or more thereof may be used. Also, a metallic lithium thin film may be used as the negative electrode active material. Furthermore, both low crystalline carbon and high crystalline carbon may be used as the carbon material. Typical examples of the low crystalline carbon may be soft carbon and hard carbon, and typical examples of the high crystalline carbon may be irregular, planar, flaky, spherical, or fibrous natural graphite or artificial graphite, Kish graphite, pyrolytic carbon, mesophase pitch-based carbon fibers, meso-carbon microbeads, mesophase pitches, and high-temperature sintered carbon such as petroleum or coal tar pitch derived cokes.

Also, the binder and the conductive agent may be the same as those previously described in the positive electrode.

In the lithium secondary battery, the separator separates the negative electrode and the positive electrode and provides a movement path of lithium ions, wherein any separator may be used as the separator without particular limitation as long as it is typically used in a lithium secondary battery, and particularly, a separator having high moisture-retention ability for an electrolyte as well as low resistance to the transfer of electrolyte ions may be used. Specifically, a porous polymer film, for example, a porous polymer film prepared from a polyolefin-based polymer, such as an ethylene homopolymer, a propylene homopolymer, an ethylene/butene copolymer, an ethylene/hexene copolymer, and an ethylene/methacrylate copolymer, or a laminated structure having two or more layers thereof may be used. Also, a typical porous nonwoven fabric, for example, a nonwoven fabric formed of high melting point glass fibers or polyethylene terephthalate fibers may be used. Furthermore, a coated separator including a ceramic component or a polymer material may be used to secure heat resistance or mechanical strength, and the separator having a single layer or multilayer structure may be selectively used.

Also, the electrolyte used in the present invention may include an organic liquid electrolyte, an inorganic liquid electrolyte, a solid polymer electrolyte, a gel-type polymer electrolyte, a solid inorganic electrolyte, or a molten-type inorganic electrolyte which may be used in the preparation of the lithium secondary battery, but the present invention is not limited thereto.

Specifically, the electrolyte may include an organic solvent and a lithium salt.

Any organic solvent may be used as the organic solvent without particular limitation so long as it may function as a medium through which ions involved in an electrochemical reaction of the battery may move. Specifically, an ester-based solvent such as methyl acetate, ethyl acetate, γ-butyrolactone, and ε-caprolactone; an ether-based solvent such as dibutyl ether or tetrahydrofuran; a ketone-based solvent such as cyclohexanone; an aromatic hydrocarbon-based solvent such as benzene and fluorobenzene; or a carbonate-based solvent such as dimethyl carbonate (DMC), diethyl carbonate (DEC), methylethyl carbonate (MEC), ethylmethyl carbonate (EMC), ethylene carbonate (EC), and propylene carbonate (PC); an alcohol-based solvent such as ethyl alcohol and isopropyl alcohol; nitriles such as R—CN (where R is a linear, branched, or cyclic C2-C20 hydrocarbon group and may include a double-bond aromatic ring or ether bond); amides such as dimethylformamide; dioxolanes such as 1,3-dioxolane; or sulfolanes may be used as the organic solvent. Among these solvents, the carbonate-based solvent may be used, and, for example, a mixture of a cyclic carbonate (e.g., ethylene carbonate or propylene carbonate) having high ionic conductivity and high dielectric constant, which may increase charge/discharge performance of the battery, and a low-viscosity linear carbonate-based compound (e.g., ethylmethyl carbonate, dimethyl carbonate, or diethyl carbonate) may be used. In this case, the performance of the electrolyte solution may be excellent when the cyclic carbonate and the chain carbonate are mixed in a volume ratio of about 1:1 to about 1:9.

The lithium salt may be used without particular limitation as long as it is a compound capable of providing lithium ions used in the lithium secondary battery. Specifically, $LiPF_6$, $LiClO_4$, $LiAsF_6$, $LiBF_4$, $LiSbF_6$, $LiAlO_4$, $LiAlCl_4$, $LiCF_3SO_3$, $LiC_4F_9SO_3$, $LiN(C_2F_5SO_3)_2$, $LiN(C2F_5SO_2)_2$, $LiN(CF_3SO_2)_2$, LiCl, LiI, or $LiB(C_2O_4)_2$ may be used as the lithium salt. The lithium salt may be used in a concentration range of 0.1 M to 2.0 M. In a case in which the concentration of the lithium salt is included within the above range, since the electrolyte may have appropriate conductivity and viscosity, excellent performance of the electrolyte may be obtained and lithium ions may effectively move.

In order to improve life characteristics of the battery, suppress the reduction in battery capacity, and improve discharge capacity of the battery, at least one additive, for example, a halo-alkylene carbonate-based compound such as difluoroethylene carbonate, pyridine, triethylphosphite, triethanolamine, cyclic ether, ethylenediamine, n-glyme, hexamethylphosphoric triamide, a nitrobenzene derivative, sulfur, a quinone imine dye, N-substituted oxazolidinone, N,N-substituted imidazolidine, ethylene glycol dialkyl ether, an ammonium salt, pyrrole, 2-methoxy ethanol, or aluminum trichloride, may be further added to the electrolyte in addition to the electrolyte components. In this case, the additive may be included in an amount of 0.1 wt % to 5 wt % based on a total weight of the electrolyte.

As described above, since the lithium secondary battery including the positive electrode active material according to the present invention stably exhibits excellent discharge capacity, output characteristics, and capacity retention, the lithium secondary battery is suitable for portable devices, such as mobile phones, notebook computers, and digital cameras, and electric cars such as hybrid electric vehicles (HEVs).

Thus, according to another embodiment of the present invention, a battery module including the lithium secondary battery as a unit cell and a battery pack including the battery module are provided.

The battery module or the battery pack may be used as a power source of at least one medium and large sized device of a power tool; electric cars including an electric vehicle (EV), a hybrid electric vehicle, and a plug-in hybrid electric vehicle (PHEV); or a power storage system.

Hereinafter, examples of the present invention will be described in detail in such a manner that it may easily be carried out by a person with ordinary skill in the art to which the present invention pertains.

Example 1

After a $LiNi_{0.8}Co_{0.1}Mn_{0.1}O_2$ lithium composite transition metal oxide was added into an atomic layer deposition (ALD) reactor and a $P_2O_5$ moisture absorbent was added to set a moisture content of the lithium composite transition metal oxide in the reactor to 250 ppm, the inside of the reactor was made into a vacuum state. Thereafter, when trimethyl aluminum (TMA) was injected as a coating metal precursor into the reactor at 100° C., the coating metal precursor vaporized to form an $Al_2O_3$ metal oxide coating layer on surfaces of particles of the lithium composite transition metal oxide. The above processes were set as one cycle and a total of 6 cycles was performed to form an $Al_2O_3$ metal oxide coating layer (thickness: 1.18 nm) so that a positive active material was prepared.

Example 2

A positive electrode active material was prepared in the same manner as in Example 1 except that, as a moisture absorbent, CaO was used instead of $P_2O_5$.

Comparative Example 1

A positive electrode active material of a $LiNi_{0.8}Co_{0.1}Mn_{0.1}O_2$ lithium composite transition metal oxide without atomic layer deposition (ALD) coating was prepared.

Comparative Example 2

A positive electrode active material was prepared in the same manner as in Example 1 except that $P_2O_5$ was not added as a moisture absorbent and a total of 5 cycles was performed.

Experimental Example 1: Positive Electrode Active Material Observation

Transmission electron microscope (TEM) images of the positive electrode active materials prepared in Examples 1 and 2 and Comparative Examples 1 and 2 are illustrated in FIGS. 2 to 5.

Referring to FIGS. 2 to 5, with respect to Examples 1 and 2 and Comparative Example 2 which were subjected to atomic layer deposition (ALD) coating, it may be confirmed that a coating layer was formed on the surface of the positive electrode active material in comparison to Comparative Example 1 without atomic layer deposition (ALD) coating. With respect to Example 1 using the $P_2O_5$ moisture absorbent, the coating layer had a thickness of about 1.18 nm and was evenly distributed over the entire surface of the positive electrode active material. With respect to Example 2 using the CaO moisture absorbent, a thickness of the coating layer was about 0.4 nm to 1.3 nm, wherein the coating layer was evenly distributed over the entire surface, but a degree of uniformity was slightly inferior to that of using the $P_2O_5$ moisture absorbent. With respect to Comparative Example 2 subjected to the atomic layer deposition (ALD) coating without a moisture absorbent, it may be confirmed that a thickness of the coating layer was relatively non-uniform, ranging from 0 nm to 2.3 nm, and there was also an uncoated surface.

Experimental Example 2: Moisture Content Measurement

Moisture contents of the positive electrode active materials prepared in Examples 1 and 2 and Comparative Example 2 were measured using a Karl Fischer instrument. The results thereof are presented in Table 1 below.

TABLE 1

|  | Example 1 | Example 2 | Comparative Example 2 |
|---|---|---|---|
| Moisture content (ppm) | 191 | 295 | 422 |

Referring to Table 1, with respect to Examples 1 and 2 using the moisture absorbent during atomic layer deposition (ALD), it was confirmed that the moisture contents of the finally prepared positive active materials were low at 300 ppm or less. In contrast, with respect to Comparative Example 2 without using the moisture absorbent, since moisture was not controlled, the moisture content of the finally prepared positive active material detected was high at 400 ppm or more. Depending on a type of the moisture absorbent, it was found that the moisture content of Example 1 using $P_2O_5$ was lower than that of Example 2 using CaO.

Experimental Example 3: Coating Amount Measurement

Inductively coupled plasma-optical emission spectrometry (ICP-OES) analysis was performed on the positive electrode active materials of Examples 1 and 2 and Comparative Examples 1 and 2 to measure coating amounts of an aluminum element. The results thereof are presented in Table 2 below.

TABLE 2

|  | Example 1 | Example 2 | Comparative Example 1 | Comparative Example 2 |
|---|---|---|---|---|
| Al coating amount (wt %) | 0.58 | 0.39 | 0 | 0.36 |

Referring to Table 2, it may be confirmed that Examples 1 and 2 using the moisture absorbent during atomic layer deposition (ALD) had a higher amount of the coating element than Comparative Example 2 without using the moisture absorbent. That is, with respect to Examples 1 and 2, coating yield was increased in comparison to Comparative Example 2. Depending on the type of the moisture absorbent, the coating yield of Example 1 using $P_2O_5$ was more significantly increased than that of Example 2 using CaO.

Experimental Example 4: Life Characteristics

Each of the positive electrode active materials prepared in Examples 1 and 2 and Comparative Examples 1 and 2, a carbon black conductive agent, and a PVdF binder were mixed in an N-methylpyrrolidone solvent at a weight ratio of 96:2:2 to prepare a positive electrode material mixture, and one surface of an aluminum current collector was coated with the positive electrode material mixture, dried at 100° C., and then rolled to prepare a positive electrode.

Lithium metal was used as a negative electrode.

Each lithium secondary battery was prepared by preparing an electrode assembly by disposing a porous polyethylene separator between the positive electrode and negative electrode prepared as described above, disposing the electrode assembly in a case, and then injecting an electrolyte solution into the case. In this case, the electrolyte solution was prepared by dissolving 1.0 M lithium hexafluorophosphate ($LiPF_6$) in an organic solvent composed of ethylene carbonate/ethylmethyl carbonate/diethyl carbonate (mixing volume ratio of EC/EMC/DEC=3/4/3).

Each lithium secondary battery half-cell prepared as described above was charged at 0.7 C to a voltage of 4.2 V in a constant current/constant voltage (CCCV) mode at 45° C. (termination current of 1/20 C), and discharged at a constant current of 0.5 C to a voltage of 3.0 V to measure capacity retention when 100 cycles of charge and discharge were performed so that life characteristics evaluation was performed. The results thereof are presented in Table 3 below.

TABLE 3

|  | Example 1 | Example 2 | Comparative Example 1 | Comparative Example 2 |
|---|---|---|---|---|
| Capacity retention (%) | 97.8 | 96.9 | 95.5 | 93.9 |

Referring to Table 3, it was found that capacity retentions of the positive electrode active materials of Examples 1 and 2 were higher than those of Comparative Examples 1 and 2.

Experimental Example 5: Film Resistance Characteristics

Electrochemical impedance spectroscopy (EIS) at the first cycle and $100^{th}$ cycle were measured for each lithium secondary battery half-cell prepared as in Experimental Example 4, and resistances per unit weight of the positive electrode active material in this case are presented in Table 4 below.

TABLE 4

|  | Example 1 | Example 2 | Comparative Example 1 | Comparative Example 2 |
|---|---|---|---|---|
| First cycle resistance (Ωg) | 2.20 | 2.14 | 1.82 | 1.91 |
| 100$^{th}$ cycle resistance (Ωg) | 5.87 | 7.33 | 9.94 | 8.75 |

Referring to Table 4, resistances after performing one charge and discharge cycle of Examples 1 and 2 and Comparative Examples 1 and 2 were similar to one another, but resistances when the coating layer was formed were slightly larger. This was due to film resistance caused by the coating layer formed at an interface. When EIS was measured after 100 charge and discharge cycles, a resistance value of Comparative Example 1, in which no treatment was performed on the surface, was 9.94 Ωg, wherein the resistance value was increased by 5.46 times that of the first cycle. In contrast, Examples 1 and 2 had a significantly less increase in the resistance in comparison to Comparative Example 1. Examples 1 and 2 also had a relatively small increase in the resistance in comparison to Comparative Example 2 without using the moisture absorbent.

The invention claimed is:

1. A method of preparing a positive electrode active material for a secondary battery, the method comprising:
   preparing a lithium composite transition metal oxide which includes nickel, cobalt, and manganese and contains 60 mol % or more of the nickel among all metals except lithium;
   adding a moisture absorbent and the lithium composite transition metal oxide into an atomic layer deposition (ALD) reactor; and
   adding a coating metal precursor into the atomic layer deposition (ALD) reactor, and forming a metal oxide coating layer from the coating metal precursor on surfaces of particles of the lithium composite transition metal oxide by an atomic layer deposition (ALD).

2. The method of claim 1, wherein the moisture absorbent is at least one selected from the group consisting of $P_2O_5$, $K_2O$, CaO, $Na_2O$, zeolite, LiO, and MgO.

3. The method of claim 1, wherein a moisture content of the lithium composite transition metal oxide in the atomic layer deposition (ALD) reactor is 300 ppm or less before performing the atomic layer deposition (ALD).

4. The method of claim 3, wherein the moisture content of the lithium composite transition metal oxide in the atomic layer deposition (ALD) reactor is 200 ppm to 250 ppm.

5. The method of claim 1, wherein inside of the atomic layer deposition (ALD) reactor is in a vacuum state before performing the atomic layer deposition (ALD).

6. The method of claim 1, wherein the metal oxide coating layer comprises at least one selected from the group consisting of $Al_2O_3$, $TiO_2$, $SiO_2$, $ZrO_2$, $VO_2$, $V_2O_5$, $Nb_2O_5$, MgO, $TaO_2$, $Ta_2O_5$, $B_2O_2$, $B_{403}$, $B_{405}$, ZnO, SnO, $HfO_2$, $Er_2O_3$, $La_2O_3$, $In_{203}$, $Y_2O_3$, $Ce_2O_3$, $Sc_2O_3$, or $W_2O_3$.

7. The method of claim 1, wherein a thickness of the metal oxide coating layer is 1.5 nm or less.

8. The method of claim 7, wherein the thickness of the metal oxide coating layer is in a range of 0.8 nm to 1.2 nm.

9. The method of claim 1, wherein the atomic layer deposition (ALD) is performed for 1 cycle to 8 cycles.

10. The method of claim 1, wherein the lithium composite transition metal oxide is represented by Formula 1:

$$Li_aNi_{1-b-c-d}Co_bMn_cQ_dO_{2+\delta} \quad [\text{Formula 1}]$$

wherein, Q is at least one element selected from the group consisting of aluminum (Al), magnesium (Mg), vanadium (V), titanium (Ti), and zirconium (Zr), 1.0≤a≤1.5, 0<b≤0.5, 0<c≤0.5, 0≤d≤0.1, 0<b+c+d≤0.4, and −0.1≤δ≤1.0.

11. The method of claim 1, wherein the lithium composite transition metal oxide contains 80 mol % or more of the nickel among the metals except lithium.

12. The method of claim 1, wherein the positive electrode active material has a moisture content of 300 ppm or less.

13. The method of claim 1, wherein the positive electrode active material has a moisture content of 200 ppm to 250 ppm.

* * * * *